(12) United States Patent
Pawlowski

(10) Patent No.: US 11,256,570 B2
(45) Date of Patent: Feb. 22, 2022

(54) PROGRESSIVE LENGTH ERROR CONTROL CODE

(71) Applicant: Micron Technology, Inc., Boise, ID (US)

(72) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/075,424

(22) Filed: Oct. 20, 2020

(65) Prior Publication Data
US 2021/0034461 A1 Feb. 4, 2021

Related U.S. Application Data

(63) Continuation of application No. 16/457,448, filed on Jun. 28, 2019, now Pat. No. 10,838,813, which is a continuation of application No. 16/105,663, filed on Aug. 20, 2018, now Pat. No. 10,733,050, which is a continuation of application No. 15/988,962, filed on May 24, 2018, now Pat. No. 10,409,680.

(51) Int. Cl.
*G06F 11/10* (2006.01)
*G06F 3/06* (2006.01)

(52) U.S. Cl.
CPC ........ *G06F 11/1076* (2013.01); *G06F 3/0619* (2013.01); *G06F 3/0659* (2013.01); *G06F 3/0673* (2013.01)

(58) Field of Classification Search
None
See application file for complete search history.

(56) References Cited

U.S. PATENT DOCUMENTS

| | | |
|---|---|---|
| 2007/0089044 A1 | 4/2007 | Goma et al. |
| 2009/0271681 A1 | 10/2009 | Piret et al. |
| 2010/0174973 A1 | 7/2010 | Landschaft et al. |
| 2013/0124945 A1 | 5/2013 | Hu et al. |
| 2015/0347225 A1 | 12/2015 | Pawlowski |
| 2016/0248446 A1 | 8/2016 | Kim et al. |

FOREIGN PATENT DOCUMENTS

WO 2016-085628 A1 6/2016

OTHER PUBLICATIONS

International Search Report and Written Opinion issued in PCT/US2019/028768, dated Aug. 29, 2019 (9 pages).

*Primary Examiner* — Guerrier Merant
(74) *Attorney, Agent, or Firm* — Fletcher Yoder, P.C.

(57) ABSTRACT

Devices and methods may be used to append a scalable (1) of parity bits in a data packet that scales with a number of data bits in a payload of the data packet. The parity bits may be generated utilizing a table of entries. In some examples, each entry in the table corresponds to a number of the data bits to be included in the payload; and each column of the table may be used to generate a corresponding parity bit of the one or more parity bits.

20 Claims, 4 Drawing Sheets

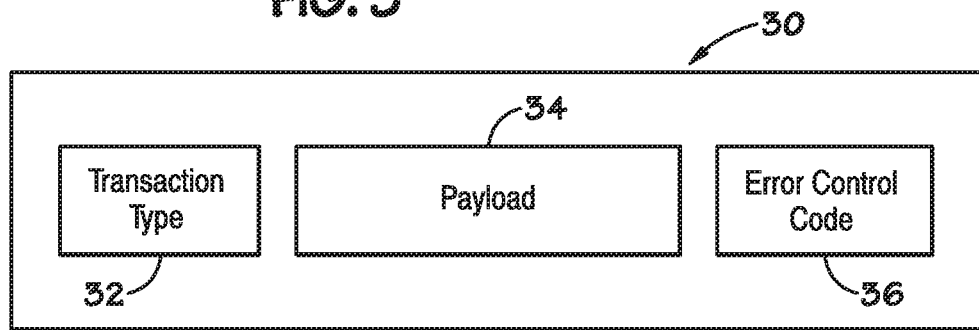
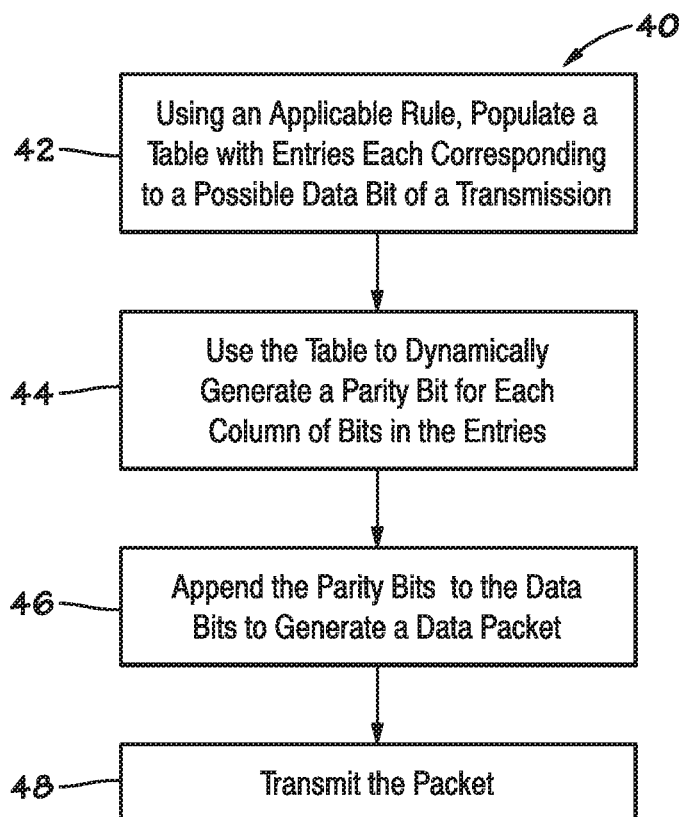

PROGRESSIVE LENGTH ERROR CONTROL CODE

CROSS REFERENCE TO RELATED APPLICATION

This application is a continuation of U.S. application Ser. No. 16/457,448, filed on Jun. 28, 2019, which is a continuation of U.S. application Ser. No. 16/105,663, filed on Aug. 20, 2018, which is a continuation of U.S. application Ser. No. 15/988,962, filed May 24, 2018, both of which are entitled "PROGRESSIVE LENGTH ERROR CONTROL CODE," the contents of which are herein expressly incorporated by reference for all purposes.

BACKGROUND

Field of the Present Disclosure

Embodiments of the present disclosure relate generally to the field of data transmission. More specifically, embodiments of the present disclosure are generally related to a progressive length error control code that utilizes a number of parity bits that scales in relation to a number of data bits included in a data transmission.

Description of the Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Conventional protocols generally transmit packets (e.g., between/within memory devices using internal data buses and/or through networks) with low failure rates. However, as industries aim to minimize the amount of energy involved in moving packets of data between memory devices and other components, protocol developers look to develop protocols that efficiently move packets of data using a reduced amount of energy, while maintaining the integrity of the packet transmission. One component of these conventional protocols often includes error control codes (ECC), such as a cyclic redundancy check (CRC). For instance, the Internet Protocol utilizes CRC32.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which:

FIG. 3 illustrates a packet level view of a packet that may be transmitted within/without the computing system of FIG. 1 via a data bus, in accordance with an embodiment;

FIG. 4 illustrates a flow diagram of a process for generating parity bits for a transmission of a data packet, in accordance with an embodiment;

DETAILED DESCRIPTION

Figure 1:
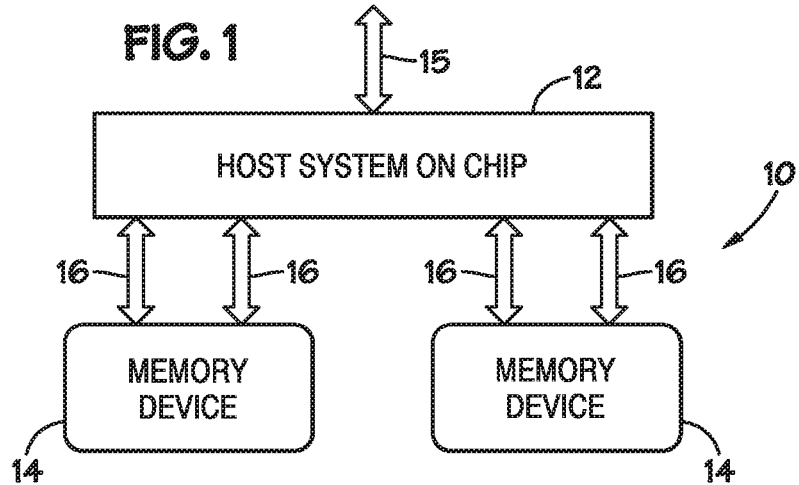
FIG. 1 illustrates a block diagram of an example of a computing system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As will be discussed in detail below, the present disclosure generally relates to scalable ECC. This may provide solutions to the problems associated with other error detection or ECC schemes. For example, the number of bits used for the ECC may be statically determined and may not scale with the number of data bits in the payload that it is verifying. Thus, the amount of bits consumed by the ECC may not be commensurate with the number of bits in the data packet. In other words, the ECC may consume too many bits when the packet is small and/or may limit a number of data bits in the packet to a length that is too small for available bandwidth since the ECC is not scalable. For example, CRC32 used in the Internet Protocol may be inflexible or not scalable, and may thus be relatively inefficient. But as described herein, the present disclosure provides a scalable ECC scheme. That is, a memory system protocol utilizing the scalable ECC may adjust certain operations based on characteristics (e.g., number of data bits) of the data packets (e.g., requests, responses) being transferred.

In an embodiment, the memory system protocol, hereinafter "the protocol," may be a packet-based protocol that enables an efficient (e.g., power efficient, bit efficient) transmittal of packets of data within memory devices, between memory devices, within/between computing devices, and/or between any other electronic devices that transfer data using data buses. The protocol may be implemented in a number of combinations with various types of memory and processors, such as Processors-in-Memory, network devices, storage appliances, hierarchical memories, abstracted memories (e.g., Dynamic Random-Access Memory (DRAM), NAND, and emerging memories), and the like. As used herein, processors may include any suitable processor, such as central processing units (CPUs) or application-specific integrated circuits (ASICs), capable of performing executable instructions on a corresponding electronic device. The protocol may also facilitate communication between/within a broad range of devices including data center switches/routers, network routers, mobile devices, storage devices, processors, processor-in-memory, work-moving-processors, secure memories, virtual networks, abstracted memories, and the like.

In certain embodiments, the protocol may be designed to facilitate communication of data packets between/within various types of memory and processors while maintaining a low protocol overhead by reducing a number of parity bits used for ECC for smaller payloads and scaling up the number of parity bits used for ECC for larger payloads without changing a type of ECC processing. In other words, the protocol may be designed to provide a bit efficient transfer of data packets in that excess bits in the ECC may be omitted for smaller payloads without limiting the payload length to the smaller payloads for other transmissions and without changing ECC rules between payload lengths.

As discussed above, industries are more focused on minimizing data movement energy. That is, developers look to reduce the amount of energy consumed moving data packets between/within memory devices. As such, the protocol may obviate the transfer of bits of an error control code (ECC) when verification of the payload does not use the additional bits of the ECC. In other words, the protocol may implement an error control strategy that minimizes overhead using a dynamic ECC field size that adjusts based on the amount of data (e.g., payload) being transmitted in the respective packet without changing how the ECC is processed and used.

Keeping the foregoing in mind, the present disclosure describes a number of systems and techniques that may be implemented within the protocol to provide for the aforementioned advantages. Although certain systems or techniques detailed below are described independently with respect to other systems or techniques, it should be noted that each of the systems and techniques described herein may be implemented with various other systems and techniques also described herein.

Turning now to the drawings, FIG. 1 illustrates a block diagram of a computing system 10 that may employ various techniques and/or systems described herein. The computing system 10 may be any of a variety of computing devices, such as a computer, pager, cellular phone, personal organizer, control circuit, etc. The computing system 10 may include a host system on chip (SoC) 12 that may be coupled to a number of memory devices 14. The host SoC 12 may also communicate with other devices using external channel(s) 15, such as network connections and/or the Internet. The host SoC 12 may include an integrated circuit (IC) that integrates multiple components of a computer or other electronic system into a single chip. As such, the host SoC 12 may include one or more processors, such as a microprocessor, that may control the processing of system functions and requests in the computing system 10.

As mentioned above, the host SoC 12 may be coupled to the memory devices 14. In certain embodiments, the host SoC 12 may be coupled to the memory devices 14 via channels 16. The channels 16 may include buses, electrical wiring, or the like.

Figure 2:
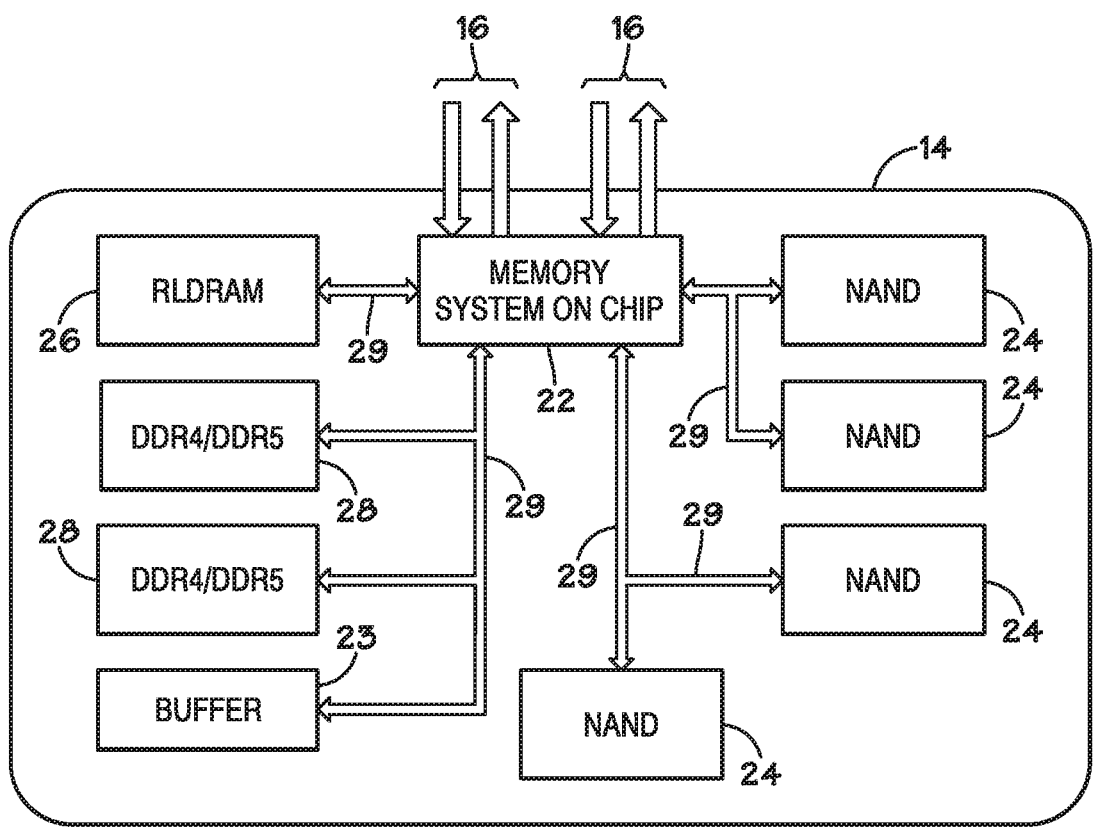
FIG. 2 illustrates a block diagram of an example of a memory device which may be part of the computing system of FIG. 1, in accordance with an embodiment.

FIG. 2 depicts a block diagram of an embodiment of the memory device 14. The memory device 14 may include any storage device designed to retain digital data. The memory device 14 may encompass a wide variety of memory components including volatile memory and/or non-volatile memory. Volatile memory may include Dynamic Random Access Memory (DRAM) and/or Static Random Access Memory (SRAM). Moreover, the volatile memory may include a number of memory modules, such as single inline memory modules (SIMMs) or dual inline memory modules (DIMMs).

The non-volatile memory may include a read-only memory (ROM), such as an EPROM, and/or flash memory (e.g., NAND) to be used in conjunction with the volatile memory. Additionally or alternatively, the non-volatile memory may include a high capacity memory such as a tape or disk drive memory. Other non-volatile memory may include phase change memory, 3D XPoint™, ferroelectric RAM, or the like. Non-volatile memory may sometimes be referred to as persistent memory or storage-class memory. As appreciated, the volatile memory and/or the non-volatile memory may be a tangible, non-transitory, and machine-readable medium for storing code (e.g., instructions).

As shown in FIG. 2, in certain embodiments, the memory device 14 may include a system on chip (SoC) 22 that may include any suitable processor, such as a processor-in-memory (PIM) or a central processing unit (CPU), coupled to memory components stored on the memory device 14. Generally, the SoC 22 may be included on the same silicon chip as the memory components of the memory device 14. By merging some processing and memory components into the memory device 14, the SoC 22 may manage the manner in which data requests and responses are transmitted and received between the memory components and the host SoC 12. In certain embodiments, the SoC 22 may control the traffic between the memory components to reduce latency and increase bandwidth. As will be appreciated, the host SoC 12 and the SoC 22 may employ the protocol when controlling the transmissions between memory components and other devices in accordance with embodiments described herein. As such, the protocol may operate on the channels 16 between the memory device 14 and the host SoC 12, as well as on channels 29 between the memory components and the SoC 22 and the external channel 15.

In certain embodiments, the memory device 14 may also include a buffer 23. The buffer 23 may store one or more packets received by the SoC 22. By way of example, the memory device 14 may include memory types such as NAND memories 24, Reduced-latency Dynamic random access memory (RLDRAM) 26, double data rate synchronous dynamic random-access memory type 4 (DDR4) or double data rate synchronous dynamic random-access memory type 5 (DDR5) 28, and the like.

In certain embodiments, the host SoC 12 and the SoC 22 may perform various operations based on computer-executable instructions provided via the foregoing memory components, registers, and the like. The memory components or storage may be any suitable articles of manufacture that may serve as media to store processor-executable code, data, or the like, such as those previously discussed. These articles of manufacture may represent tangible, non-transitory, and computer-readable media (i.e., any suitable form of memory or storage) that may store the processor-executable code used by the host SoC 12 or the SoC 22 to perform the presently disclosed techniques. The memory and the storage may also be used to store the data, analyze the data, and the like. The memory and the storage may represent tangible, non-transitory, and computer-readable media (e.g., the NAND memories 24, the RLDRAM 26, the DDR4/DDR5 28, and/or any suitable form of memory or storage) that may store the processor-executable code used by the host SoC 12 or the SoC 22 to perform various techniques described herein. It should be noted that the designation of "non-transitory" indicates that the media is a tangible object rather than merely an electrical signal.

Although the following description of various aspects related to the protocol is described herein as being performed with respect to the host SoC 12 and the SoC 22, it should be noted that all of the systems and techniques described herein may be performed using any suitable device. That is, the protocol may facilitate communication between any two devices, such as communications between two processors, two memory modules, a processor and a memory module, any two devices that send and/or receive transmitted data, and the like. Additionally or alternatively, the protocol may facilitate communication between components within a single electronic device.

To employ the protocol when transmitting requests and responses to or from the memory components of the memory device 14, the SoC 22/the SoC 12 may send packets of data structured according to a packet level view of a data packet 30 illustrated in FIG. 3. As shown in FIG. 3, the data packet 30 may include a transaction type field 32, a payload field 34, and an error control code (ECC) field 36. The transaction type field 32 may include data indicative of the type of transmittance, a type of packet being transmitted, or both. Additionally or alternatively, the transaction type field 32 may also indicate a packet size to indicate a number of bits in the data payload and the number of bits in the ECC field, thereby indicating the number of bits in the entire packet. In certain embodiments, the transaction type field 32 may indicate the size of the payload field 34 and the ECC field 36 in an indirect manner. For example, the data stored in the transaction type field 32 may serve as an index to a lookup table. The lookup table may provide information regarding the lengths of the payload field 34 and the ECC field 36. As such, the SoC 22 may, in one example, may receive the data packet 30 and use the data stored in the transaction type field 32 as an index to a lookup table that may be stored within the memory device 14 to determine the sizes of the payload field 34 and the ECC field 36.

In certain embodiments, the transaction type field 32 may specify different types of packets based on whether the packet is being transmitted on a request bus Q or a response bus S, which may include the channels 15, the channels 16, the channels 29, or the like. In certain embodiments, the request bus Q and the response bus S may be separate, unidirectional, or common inputs/outputs. The request bus Q generally includes q number of lanes, and the response bus S generally includes s number of lanes. As previously noted, the respective sizes of the payload field 34 and the ECC field 36 may be determined based at least in part on the data in the transaction type field 32. The payload field 34 may include the data representative of the request or response being sent via the request or response bus, respectively. The ECC field 36 may include the ECC to determine whether the data packet 30 received by the receiving component includes any errors introduced during transmission of the data packet 30. As such, the ECC may include various algorithms, such as adding redundant data or parity data, to a message, such that the original data may be verified and/or recovered by the receiving component even when a number of errors were introduced, either during the process of transmission, or on storage.

Generally, the ECC may provide the ability to detect an error within the limits of the code and indicate a further action, such as retransmitting the errant packet, when the error is detected. For example a code with a hamming distance of 3 (e.g., HD3 code) may detect two bit-errors in the payload field 34 or detect and correct one bit-error in the payload field 34. Similarly, HD4 code may detect three bit-errors in the payload field 34, detect two bit-errors in the payload field 34 and correct one of those bit-errors in the payload field 34.

Example transaction type fields 32 for data packets 30 transmitted on the request bus Q may include read operations having various bit lengths (e.g., 8, 9, or 16 bits), message data, read-modify-write (RMW) operations, pattern write operations, write-with-enable operations, write operations of various bit lengths, and the like. Providing variable bit lengths for operations (e.g., read operations and/or write operations) may provide flexibility to a system designer in selecting a maximum packet size of transfer. For example, in an embodiment, the protocol may have a limit of 256 bits, but using a smaller maximum packet size may decrease system latency. However, reducing payload field 34 size may cause no change in length of the ECC field 36 causing bits in the ECC field 36 to be wasted bits in the transfer consuming bandwidth of the system without increasing assurances of validity. Alternatively, different ECC types (e.g., CRC 32) may be selected based on length of the payload field 34. However, such changing between ECC types utilizes additional processing resources to select the corresponding ECC type and/or utilizes additional memory consumption to store more than one ECC encoder/decoder. Instead, as discussed below, a single scalable ECC ruleset may be used for a variety of lengths of the payload field 34 that scales a length of the ECC field 36 according to length of the payload field 34.

As previously noted, the ECC used for error detection is scalable, in accordance with an embodiment provided herein. The ECC uses a small number of parity bits to cover short data lengths and a progressively larger number of parity bits as the data length increases. As understood, in the following embodiments, the ratio of the number of parity bits to number of data bits covered by the parity bits employed is small (e.g., equal to or smaller than CRC) at any given data length with the added benefit of scalability to match the ECC to the corresponding data length. The ECC may be applied using any device and/or applied to any transmission that uses a bus for information communication, such as DRAM, NAND, emerging memory, controllers, and/or other memory devices. The ECC may also be applied for data packets of any size since the ECC is scalable.

FIG. 4 illustrates a flow diagram of a process 40 that may be used to transmit generated parity bits to detect errors in transmission or confirm that errors have not occurred. The process may be implemented by one or more processors and/or dedicated hardware (e.g., XOR gates). For example, the one or more processors may be included in the host SoC 12, the SoC 22, or a processor for another device that communicates with the SoC 12 and/or the SoC 22. Using an applicable rule, the one or more processors populate a table with entries for each possible bit length of data that may be transmitted to and/or from the SoC 12 and/or the SoC 22 (block 42). In other words, the table may include a number (e.g., 65,519) of entries (i.e., rows) that each corresponds to a potential number of bits in data. Thus, an index (e.g., 65,519) corresponds to the corresponding bit (e.g., $65{,}519^{th}$ bit) in the data. However, the rule for the table may be applied to generate values for the entries. In some embodiments, the rule may include ensuring that the entries each include at least two ones in binary, ensuring that the entries include exactly three ones in binary with an odd number of ones in binary, or ensuring other various combinations of ones and zeros in binary.

The one or more processors use the table to dynamically generate a parity bit for each column of bits in the entries (block 44). Thus, the parity bits may be dynamically generated based at least in part on a number of bits in the data being transmitted in the data packet 30. As discussed below, the number of parity bits included in the data packet 30 may change as the number data bits increases by using columns of the table to determine which data bits are used to compute respective parity bits. Thus, in this manner, the table provides scalability of error detection in the ECC by adjusting the number of parity bits to include only parity bits for those columns that have non-zero values in the table without changing the ECC method of or rules for operation between different numbers of data bits included in transmission of different packets.

Once the parity bits are generated, the one or more processors may append the parity bits to data bits to generate a packet (block 46). The one or more processors then transmit the packet (block 48). Since the rule used to generate the parity bits is dynamically determined as appropriate for the number of data bits in the data of the packet, the packet is dynamically sized with parity bits based at least in part on a number of data bits. In other words, application of the rule includes identifying a quantity of data bits in a payload of a data packet. Then a quantity of parity bits for a cyclic redundancy check (CRC) is determined based at least in part on the quantity of data bits in the payload of the data packet such that the quantity of parity bits is proportional to the quantity of data bits in the payload of the data packet. The data packet is then transmitted with the payload and the quantity of parity bits for the CRC. As discussed, the ECC may use a table of entries each corresponding to a data bit that may be included in the data. Each entry may include one more bits organized into columns that are each used to generate a corresponding parity bit. The entries may be generated using a corresponding rule. For example, the rule may require that each entry conforms to specific requirements, such as each entry in the table include a number of (e.g., more than three or more than two) ones that are incremented for each additional entry corresponding to a data bit in the table.

Figure 5:
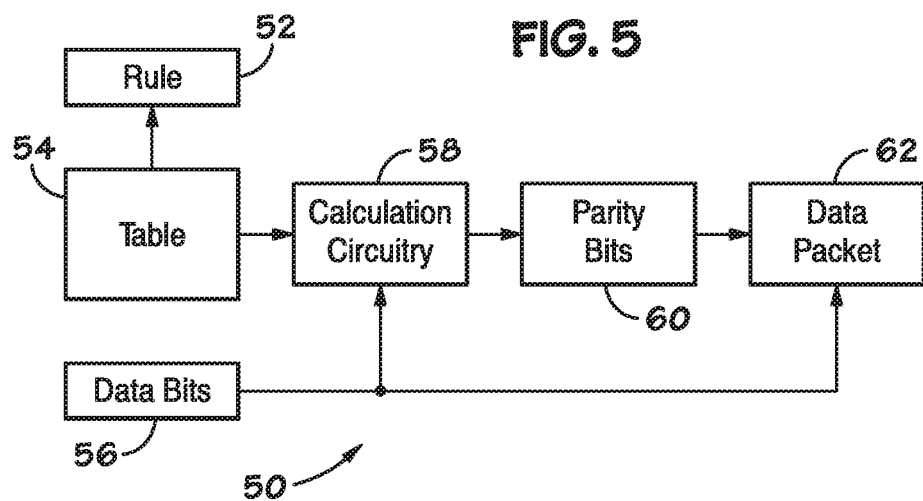
FIG. 5 illustrates a scheme used to implement the process of FIG. 4, in accordance with an embodiment.

FIG. 5 illustrates a block diagram of a scheme 50 that may be used to implement the process 40 of FIG. 4. The scheme 50 includes using a rule 52 (e.g., at least two ones per entry) to generate a table 54 with each nth entry in the table 54 corresponding to an nth data bit of possible data bits 56 that may be transmitted. Each column of the table 54 may be used by calculation circuitry 58 to generate parity bits 60 that may be included in a transmission data packet 62 where the parity bits 60 are included to enable detection of whether errors have occurred during transmission of the transmission data packet 62. As noted above, the calculation circuitry 58 may include software implementations, hardware implementations (e.g., XOR gates), and/or a combination thereof. In some embodiments with hardware implementations, the table 54 may be omitted from an implemented device once the calculation circuitry 58 is designed/built. The calculation circuitry 58 calculates a parity bit 60 for each column of the table 54 where non-zeros occur by applying XOR functions to data bits 56 corresponding to non-zero values in a column corresponding to the respective parity bit 60.

Figure 6:
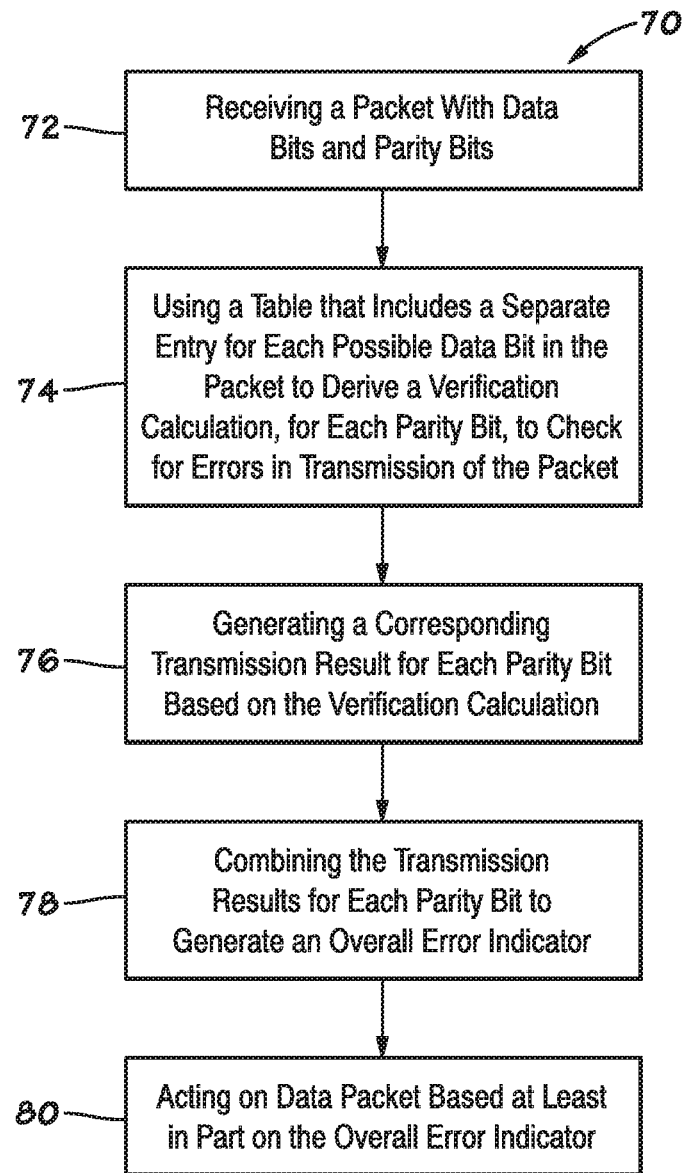
FIG. 6 illustrates a flow diagram of a process for detecting errors/ensuring that errors have not been introduced during transmission using parity bits, in accordance with an embodiment.

FIG. 6 illustrates a flow diagram of a process 70 that may be used to detect faults/ensure no faults occur in the transmission of the transmission data packet 62. The process may be implemented by one or more processors and/or dedicated hardware (e.g., XOR gates). For example, the one or more processors may be included in the host SoC 12, the SoC 22, or a processor for another device that communicates with the SoC 12 and/or the SoC 22 to receive the packet. Using the applicable rule used to generate the parity bits discussed in reference to FIG. 4, data bits and the parity bits may be used to confirm that the packet is transferred without error. The one or more processors receive the packet with data bits and parity bits (block 72). In some embodiments, the packet may also include other metadata, such as a transaction type or other metadata indicating a number of data bits and/or a number of parity bits in the packet.

The one or more processors then use a table that includes a separate entry for each possible data bit to derive a verification calculation for each parity bit that is to check for errors in transmission of the data packet (block 74). The table may be the same table as that used to generate the parity bits in FIG. 4 or may be generated using the same rule as the table used to generate the parity bits in FIG. 4. The receiving device, in hardware and/or software, generates a corresponding transmission result for each parity bit based on the verification calculation (block 76). The receiving device also combines the transmission results for each parity bit to generate an overall error indicator (block 78). The one or more processors then act on the data packet based at least in part on the overall error indicator (block 80). For example, the one or more processors may store the data bits in memory, transmit the data bits to another location, and/or other suitable actions when no transmission error is detected. Additionally or alternatively, the one or more processors may send a response to a transmitting device indicating that an error was introduced in the data packet during the transmission of the data bits when a transmission error is detected.

Figure 7:
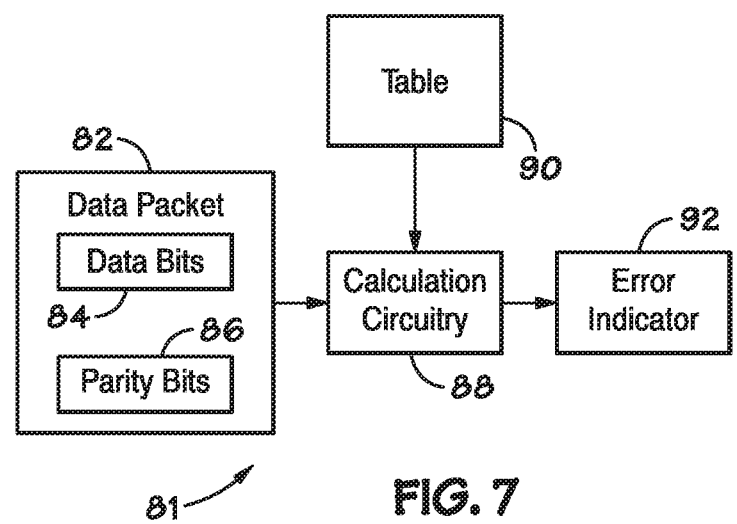
FIG. 7 illustrates a scheme used to implement the process of FIG. 6, in accordance with an embodiment.

FIG. 7 illustrates a scheme 81 that may be used to implement the process 70 of FIG. 6. A receiving device, such as the memory device 14, receives a received data packet 82 including data bits 84 and parity bits 86. When no transmission error occurs in the transmission, the received data packet 82 may be exactly the same as the transmission data packet 62. To verify such status, the receiving device utilizes calculation circuitry 88 that uses a table 90 (and/or its respective hardware implementation) to generate an error indicator 92 indicating whether or not a transmission error has occurred. For example, the error indicator 92 may be a first value (e.g., 0) when no error has been detected and a second value (e.g., 1) when an error has been detected. In some embodiments, the receiving device may generate the table 90 using the same rule used to generate the table 54. Alternatively, the transmitting and/or receiving device may utilize a table that is a copy of the table 54 or the table from which table 54 is a copy.

The calculation circuitry 88, similar to the calculation circuitry 58 of FIG. 5, may utilize hardware (e.g., XOR gates) and/or software to generate the error indicator 92. In some embodiments, the hardware implementation of the calculation circuitry 58 may be designed/built for implementation while the table 90 is not included in or used by the transmitting/receiving device during transmission/verification. Specifically, in accordance with the process 70 of FIG. 6, the calculation circuitry 88 may utilize the table 90 to determine equations for each parity bit 86 from data bits 84 by determining which entries (i.e., rows) corresponding to respective data bits 84 have non-zeros in a column of the table 90 corresponding to respective data bits have non-zero values. In some embodiments, the table 90 may be used to generate the XOR gates, then the table 90 may be foregone at runtime using the XOR gates to verify data transfers. In other words, in some embodiments, the table 90 may be used for design portions but foregone during implementation.

Table 1 illustrates a table generated using a rule where each entry is generated with each entry including two or more ones with no repeat values where each data bit corresponds to an entry with each incremented number conforming to the rule.

TABLE 1

Table of entries used with at least two values of one for each entry

| Data Bit # | Decimal | Hex | P bits | Binary |
|---|---|---|---|---|
| 1 | 3 | 3 | 2 | 00000011 |
| 2 | 5 | 5 | 3 | 00000101 |
| 3 | 6 | 6 | 3 | 00000110 |
| 4 | 7 | 7 | 3 | 00000111 |
| 5 | 9 | 9 | 4 | 00001001 |
| 6 | 10 | A | 4 | 00001010 |
| 7 | 11 | B | 4 | 00001011 |
| 8 | 12 | C | 4 | 00001100 |
| 9 | 13 | D | 4 | 00001101 |
| 10 | 14 | E | 4 | 00001110 |
| 11 | 15 | F | 4 | 00001111 |
| 12 | 17 | 11 | 5 | 00010001 |
| 13 | 18 | 12 | 5 | 00010010 |
| 14 | 19 | 13 | 5 | 00010011 |
| 15 | 20 | 14 | 5 | 00010100 |
| 16 | 21 | 15 | 5 | 00010101 |
| 17 | 22 | 16 | 5 | 00010110 |
| 18 | 23 | 17 | 5 | 00010111 |
| 19 | 24 | 18 | 5 | 00011000 |
| 20 | 25 | 19 | 5 | 00011001 |
| 21 | 26 | 1A | 5 | 00011010 |
| 22 | 27 | 1B | 5 | 00011011 |
| 23 | 28 | 1C | 5 | 00011100 |
| 24 | 29 | 1D | 5 | 00011101 |
| 25 | 30 | 1E | 5 | 00011110 |
| 26 | 31 | 1F | 5 | 00011111 |

As illustrated in the table, the right-most bit in the binary entries is the least significant bit. Also, as illustrated, 1 data bit may be verified with 2 parity bits, 2-4 data bits may be verified with 3 parity bits, 5-11 data bits may be verified with 4 parity bits, and 12-26 data bits may be verified with 5 parity bits. Similarly, the table may be expanded to any number of values. For example, the 247th data bit may correspond to a binary entry of "11111111" utilizing 8 parity bits to verify the 247 data bits.

When the right-most column of the entries corresponds to a least significant bit, the right-most column may be used to generate a first parity bit, P0. When a second data bit is included, a next right-most column may be used to generate a second parity bit, P1. Similarly, each column in the table may be used to generate a corresponding parity bit when the corresponding parity bit is to be used based on the number of data bits. For instance, if no ones appear in a column, the P-Bit may be omitted from the data packet. For example, for packets including less than 27 data bits, the packet may include only five parity bits omitting P5 since P5 always has zero values for entries 1-26.

The following utilizes an example data stream of "00101010110" with the data stream being ordered from most-significant to least-significant bits. Since the data stream includes 11 bits, 4 parity bits (e.g., P0, P1, P2, and P3) are to be generated. Using the table, P0 may be determined from the least-significant column of the entries. Thus, P0 may be determined as an exclusive OR (XOR) of data bits in the data stream where a 1 occurs in the right-most column. Thus, P0 may be calculated as D1 XOR D2 XOR D4 XOR D5 XOR D7 XOR D9 XOR D11, where D1 is a first data bit as the least-significant bit and each subsequent bit is incremented. Similarly, P1 may be calculated as D1 XOR D3 XOR D4 XOR D6 XOR D7 XOR D10 XOR D11, P2 may be calculated as D2 XOR D3 XOR D4 XOR D8 XOR D9 XOR D10 XOR D11, and P3 may be calculated as D5 XOR D6 XOR D7 XOR D8 XOR D9 XOR D10 XOR D11. As previously noted, the calculation may be made in software and/or hardware. In other words, hardware logic gates may be used to XOR the data bits together and/or the data bits may undergo XOR in software. Using the foregoing computations and the example data stream, P0=0, P1=0, P2=1, and P3=1. These parity bits are appended to the data bits in the packet.

A device (e.g., host SoC 12 or SoC 22) receiving a packet including the data bits and the parity bits may utilize the parity bits to verify the incoming data using the table or a similarly generated copy of the table used to generate the parity bits. The receiving device may determine whether P0 detects any associated errors by calculating D1 XOR D2 XOR D4 XOR D5 XOR D7 XOR D9 XOR D11 XOR P0. When no associated errors occur, the calculated transmission result value is zero. Additionally or alternatively, the receiving device may calculate a value D1 XOR D2 XOR D4 XOR D5 XOR D7 XOR D9 XOR D11 and determine whether the result is equal to the value of P0.

Similar to the calculations used to verify whether P0 tracks any errors, the tracking device may calculate whether errors have been included that are tracked by P1, P2, and P3. For example, the receiving device may calculate whether any errors are tracked in relation to P1 by evaluating whether D1 XOR D3 XOR D4 XOR D6 XOR D7 XOR D10 XOR D11 XOR P1 or whether D1 XOR D3 XOR D4 XOR D6 XOR D7 XOR D10 XOR D11 is equal to P1. Similarly, the receiving device may calculate whether any errors are tracked in relation to P2 by evaluating whether D2 XOR D3 XOR D4 XOR D8 XOR D9 XOR D10 XOR D11 XOR P2 is equal to zero or whether D2 XOR D3 XOR D4 XOR D8 XOR D9 XOR D10 XOR D11 is equal to P2. Similarly, the receiving device may calculate whether any errors are tracked in relation to P3 by evaluating whether D5 XOR D6 XOR D7 XOR D8 XOR D9 XOR D10 XOR D11 XOR P3 is equal to zero or whether D5 XOR D6 XOR D7 XOR D8 XOR D9 XOR D10 XOR D11 is equal to P3. The receiving device may then determine whether any of the results of the calculations include any erroneous values.

For example, using the foregoing example, the receiving device may determine that D1 XOR D2 XOR D4 XOR D5 XOR D7 XOR D9 XOR D11 XOR P0=D1 XOR D3 XOR D4 XOR D6 XOR D7 XOR D10 XOR D11 XOR P1=D2 XOR D3 XOR D4 XOR D8 XOR D9 XOR D10 XOR D11 XOR P2=D5 XOR D6 XOR D7 XOR D8 XOR D9 XOR D10 XOR D11 XOR P3=0. This indicates that ECC has detected no errors. However, if D1 is erroneously transferred as a value of one instead of the intended value of zero, the receiving device calculates that D1 XOR D2 XOR D4 XOR D5 XOR D7 XOR D9 XOR D11 XOR P0=D1 XOR D3 XOR D4 XOR D6 XOR D7 XOR D10 XOR D11 XOR P1=1 indicating that the ECC has detected an error. If D1 and D11 are both erroneous during transfer, the receiving device calculates that D2 XOR D3 XOR D4 XOR D8 XOR D9 XOR D10 XOR D11 XOR P2=D5 XOR D6 XOR D7 XOR D8 XOR D9 XOR D10 XOR D11 XOR P3=1 indicating that the ECC has detected an error.

As appreciated, the foregoing rules calculations may be applied to any number of data bits using a table similar to Table 1. In other words, the ECC and the resulting calculations are scalable using the table that is in turn scalable to an infinite number of entries without changing how the ECC operates. Furthermore, the rule using at least two values of one in the table generation may be used to detect two or more errors in transmission.

Table 2 illustrates a table generated using a rule where each entry is generated with each entry including at least three ones with no repeat values and where each data bit corresponds to an entry with each incremented number conforming to the rule. Additionally, the entries each include an odd number of ones in the entries.

TABLE 2

Table of entries used with at least three values of one for each entry with an odd number of ones.

| Data Bit # | Decimal | Hex | P bits | Binary |
|---|---|---|---|---|
| 1 | 7 | 7 | 3 | 000111 |
| 2 | 11 | B | 4 | 001011 |
| 3 | 13 | D | 4 | 001101 |
| 4 | 14 | E | 4 | 001110 |
| 5 | 19 | 13 | 5 | 010011 |
| 6 | 21 | 15 | 5 | 010101 |
| 7 | 22 | 16 | 5 | 010110 |
| 8 | 25 | 19 | 5 | 011001 |
| 9 | 26 | 1A | 5 | 011010 |
| 10 | 28 | 1C | 5 | 011100 |
| 11 | 31 | 1F | 5 | 011111 |
| 12 | 35 | 23 | 6 | 100011 |
| 13 | 37 | 25 | 6 | 100101 |
| 14 | 38 | 26 | 6 | 100110 |
| 15 | 41 | 29 | 6 | 101001 |
| 16 | 42 | 2A | 6 | 101010 |
| 17 | 44 | 2C | 6 | 101100 |
| 18 | 47 | 2F | 6 | 101111 |
| 19 | 49 | 31 | 6 | 110001 |
| 20 | 50 | 32 | 6 | 110010 |
| 21 | 52 | 34 | 6 | 110100 |
| 22 | 55 | 37 | 6 | 110111 |
| 23 | 56 | 38 | 6 | 111000 |
| 24 | 59 | 3B | 6 | 111011 |
| 25 | 61 | 3D | 6 | 111101 |
| 26 | 62 | 3E | 6 | 111110 |

As illustrated in the table, the right-most bit in the binary entries is the least significant bit. Also, 1 data bit may be verified with 3 parity bits, 2-4 data bits may be verified with 4 parity bits, 5-11 data bits may be verified with 5 parity bits, and 12-26 data bits may be verified with 6 parity bits. Similarly, the table may be expanded to any number of values. For example, the 247th data bit may correspond to a binary entry of "111111111" utilizing 9 bits to verify the 247 data bits.

When the right-most column of the entries corresponds to a least significant bit, the right-most column may be used to generate a first parity bit, P0. When a second data bit is included, a next right-most column may be used to generate a second parity bit, P1, and so on. In other words, each column in the table may be used to generate a corresponding parity bit when the corresponding parity bit is to be used based on the number of data bits. For instance, similar to Table 1, if no ones appear in a column (e.g., the left-most columns), the corresponding parity bit may be omitted from the packet. For example, using Table 2 for transmissions including less than 27 bits may include only six parity bits such that P6 is not included in the packet that is transmitted since P6 always has zero values for entries 1-26.

The following utilizes an example data stream of "00101010110" with the data stream being ordered from most-significant to least-significant bits. Since the data stream includes 11 bits, 5 parity bits (e.g., P0, P1, P2, P3, and P4) are to be generated. Using Table 2, P0 may be determined from the least-significant (i.e., right-most) column of the entries. Thus, P0 may be determined as an exclusive OR (XOR) of data bits in the data stream where a 1 occurs in the corresponding column. Thus, P0 may be calculated as D1 XOR D2 XOR D3 XOR D5 XOR D6 XOR D8 XOR D11, where D1 is a first data bit as the least-significant bit and each subsequent bit is incremented for each row/entry. Similarly, P1 may be calculated as D1 XOR D2 XOR D4 XOR D5 XOR D7 XOR D9 XOR D11, P2 may be calculated as D1 XOR D3 XOR D4 XOR D6 XOR D7 XOR D10 XOR D11, P3 may be calculated as D2 XOR D3 XOR D4 XOR D8 XOR D9 XOR D10 XOR D11, and P4 may be calculated as D5 XOR D6 XOR D7 XOR D8 XOR D9 XOR D10 XOR D11. The calculation may be made in software and/or hardware. In other words, hardware logic gates may be used to XOR the data bits together and/or the data bits may undergo XOR in software. Using the foregoing computations and the example data stream, P0=1, P1=0, P2=0, P3=1, and P4=1. These parity bits are appended to the data bits in the packet.

As previously discussed, a device (e.g., host SoC 12 or SoC 22) receiving a packet including the data bits and the parity bits may utilize the parity bits to verify the incoming data using the table (i.e., table 2) or a similarly generated copy of the table used to generate the parity bits. The receiving device may determine whether P0 detects any associated errors by calculating D1 XOR D2 XOR D3 XOR D5 XOR D6 XOR D8 XOR D11 XOR P0. When no associated errors occur, the calculated value may be zero. Additionally or alternatively, the receiving device may calculate a value D1 XOR D2 XOR D3 XOR D5 XOR D6 XOR D8 XOR D11 and determine whether the result is equal to the value of P0.

Similar to the calculations used to verify whether P0 tracks any errors, the tracking device may calculate whether errors have been included that are tracked by P1, P2, P3, and P4. For example, the receiving device may calculate whether any errors are tracked in relation to P1 by evaluating whether D1 XOR D2 XOR D4 XOR D5 XOR D7 XOR D9 XOR D11 XOR P1 or whether D1 XOR D2 XOR D4 XOR D5 XOR D7 XOR D9 XOR D11 is equal to P1. Similarly, the receiving device may calculate whether any errors are tracked in relation to P2 by evaluating whether D1 XOR D3 XOR D4 XOR D6 XOR D7 XOR D10 XOR D11 XOR P2 is equal to zero or whether D1 XOR D3 XOR D4 XOR D6 XOR D7 XOR D10 XOR D11 is equal to P2. Similarly, the receiving device may calculate whether any errors are detected in relation to P3 by evaluating whether D2 XOR D3 XOR D4 XOR D8 XOR D9 XOR D10 XOR D11 XOR P3 is equal to zero or whether D2 XOR D3 XOR D4 XOR D8 XOR D9 XOR D10 XOR D11 is equal to P3. Furthermore, the receiving device may calculate whether any errors are detected in relation to P4 by evaluating whether D5 XOR D6 XOR D7 XOR D8 XOR D9 XOR D10 XOR D11 XOR P4 is equal to zero or whether D5 XOR D6 XOR D7 XOR D8 XOR D9 XOR D10 XOR D11 is equal to P4. The receiving device may then determine whether any of the results of the calculations include any erroneous values.

For example, using the foregoing example, the receiving device may determine that D1 XOR D2 XOR D3 XOR D5 XOR D6 XOR D8 XOR D11 XOR P0=D1 XOR D2 XOR D4 XOR D5 XOR D7 XOR D9 XOR D11 XOR P1=D1 XOR D3 XOR D4 XOR D6 XOR D7 XOR D10 XOR D11 XOR P2=D2 XOR D3 XOR D4 XOR D8 XOR D9 XOR D10 XOR D11 XOR P3=D5 XOR D6 XOR D7 XOR D8 XOR D9 XOR D10 XOR D11 XOR P4=0. This indicates that the receiving device has detected no errors using the ECC. However, if D1 is erroneously transferred, the receiving device calculates that D1 XOR D2 XOR D3 XOR D5 XOR D6 XOR D8 XOR D11 XOR P0=D1 XOR D2 XOR D4 XOR D5 XOR D7 XOR D9 XOR D11 XOR P1=D1 XOR D3 XOR D4 XOR D6 XOR D7 XOR D10 XOR D11 XOR P2=1 indicating that the ECC has detected an error. If D1 and D11 are both erroneous during transfer, the receiving device calculates that D2 XOR D3 XOR D4 XOR D8 XOR D9 XOR D10 XOR D11 XOR P3=D5 XOR D6 XOR D7 XOR D8 XOR D9 XOR D10 XOR D11 XOR P4=1 indicating that the ECC has detected an error. Similarly, if D1, D6, and D11 are all erroneous, the receiving device calculates that D1 XOR D2 XOR D3 XOR D5 XOR D6 XOR D8 XOR D11 XOR P0=D1 XOR D3 XOR D4 XOR D6 XOR D7 XOR D10 XOR D11 XOR P2=D2 XOR D3 XOR D4 XOR D8 XOR D9 XOR D10 XOR D11 XOR P3=1 indicating that the ECC has detected an error.

The foregoing rules calculations may be applied to any number of data bits using a table similar to Table 2. In other words, the ECC and the resulting calculations are scalable using the table that is in turn scalable to an infinite number of row/entries corresponding to an infinite number of data bits. Furthermore, the rule using at least three values of one in the table generation may be used to detect three or more errors in transmission. In some embodiments, multiple tables and/or XOR implementations may be included for use. For example, Table 1 and Table 2 (or their related XOR implementations) may be included and selected between for the specific mode being used to verify transmission.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A method, comprising:
   generating an error control code based on data, wherein generating the error control code comprises:
      assigning a binary number for each data bit in the data by assigning each data bit a binary number having a defined number of ones in binary, wherein successive bits are assigned successive binary numbers that satisfy the defined number of ones;
      determining that a number of parity bits is to be calculated based on a length of the binary numbers corresponding to the parity bits; and
      calculating a parity bit for columns of the binary numbers, wherein the parity bits are each calculated by performing exclusive OR ("XOR") calculations on data bits having a binary one in a respective column of the columns of the respective binary numbers corresponding to the respective parity bit; and
   transmitting the data with the error control code having the parity bits.

2. The method of claim 1, wherein the number of parity bits is based at least in part on a location of a left-most non-zero most significant bit in the assigned successive binary numbers.

3. The method of claim 2, wherein the left-most non-zero most significant bit is located in a last data bit of the data.

4. The method of claim 1, wherein the defined number of ones comprises having at least two ones.

5. The method of claim 4, wherein the error control code comprises a hamming distance of three.

6. The method of claim 1, wherein the defined number of ones comprises having at least three ones.

7. The method of claim 6, wherein the defined number of ones comprises having an odd number of ones.

8. The method of claim 7, wherein the error control code comprises a hamming distance of four.

9. The method of claim 1, wherein performing the XOR calculations on data bits having a binary one in the column corresponding to the respective parity bit comprises performing the XOR calculations using a plurality of XOR gates.

10. The method of claim 1, wherein transmitting the error control code with the data comprises encoding the error control code and the data in one or more data packets, wherein each of the one or more data packets comprises a transaction type field comprising an indication indicative of a first quantity of data bits in a payload of the respective data packet of the one or more data packets and a second quantity of parity bits in the error control code in the respective data packet.

11. The method of claim 10, wherein the indication comprises a binary value that corresponds to one of a plurality of transaction types, wherein each of the plurality of transaction types is associated with a data operation for a network device generating the one or more data packets.

12. The method of claim 1, wherein a first data bit of the data bits is assigned to a lowest binary number satisfying the defined number of ones.

13. A system, comprising:
   a memory component configured to store instructions; and
   one or more processors, that when executing the instructions, are configured to:
      generate one or more data packets, wherein each data packet of the one or more data packets comprises:
         a payload field comprising one or more data bits as a payload for the data packet; and
         an error control code field comprising one or more parity bits, wherein the one or more processors are configured to generate the error control field by:
            assigning a binary number to each data bit with the binary number having a defined number of ones in binary, wherein successive bits are assigned successive binary numbers that satisfy the defined number of ones;
            determining that a number of parity bits is to be calculated based on a length of the binary numbers corresponding to the parity bits; and
            calculating a parity bit for columns of the binary numbers, wherein the parity bits are each calculated by performing exclusive OR ("XOR") calculations on data bits having a binary one in the column corresponding to the respective parity bit; and
      transmit the one or more data packets.

14. The system of claim 13, comprising a plurality of XOR gates, wherein the processors are configured to perform the XOR calculations using the plurality of XOR gates.

15. The system of claim 13, wherein the number of parity bits is determined based at least in part on a position of a left-most non-zero most significant bit in a last data bit of the one or more data bits.

16. The system of claim 13, wherein the defined number of ones comprises having at least two ones.

17. The system of claim 13, wherein the defined number of ones comprises having at least three ones and an odd number of ones.

18. An electronic device, comprising:
an input configured to receive a data packet comprising data bits and parity bits;
one or more processors configured to:
assign a binary number for each data bit in the data packet by assigning each data bit a binary number having a defined number of ones in binary, wherein successive data bits are assigned successive binary numbers that satisfy the defined number of ones;
determine that a number of local parity bits is to be calculated based on a length of the binary numbers corresponding to the parity bits;
calculate a local parity bit for the columns of the binary numbers, wherein the local parity bits are each calculated by performing exclusive OR ("XOR") calculations on data bits having a binary one in the column of the respective binary numbers corresponding to the respective local parity bit;
compare the local parity bits to the parity bits; and
act on the data packet based at least in part on the comparison of the parity bits and the local parity bits.

19. The electronic device of claim 18, wherein the defined number of ones comprises:
having more than two ones; or
having more than three ones and an odd number of ones.

20. The electronic device of claim 18, wherein acting on the data packet comprises invalidating the data packet when more than a threshold number of parity bits do not match the local parity bits.

* * * * *